US008853091B2

(12) United States Patent
Sato et al.

(10) Patent No.: US 8,853,091 B2
(45) Date of Patent: Oct. 7, 2014

(54) METHOD FOR MANUFACTURING A SEMICONDUCTOR DIE WITH MULTIPLE DEPTH SHALLOW TRENCH ISOLATION

(75) Inventors: Justin H. Sato, West Linn, OR (US); Brian Hennes, Portland, OR (US); Greg Stom, Damascus, OR (US); Robert P. Ma, Phoenix, AZ (US); Walter E. Lundy, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 615 days.

(21) Appl. No.: 12/685,998

(22) Filed: Jan. 12, 2010

(65) Prior Publication Data
US 2010/0184295 A1 Jul. 22, 2010

Related U.S. Application Data

(60) Provisional application No. 61/145,354, filed on Jan. 16, 2009.

(51) Int. Cl.
*H01L 21/306* (2006.01)
*H01L 21/762* (2006.01)
*H01L 21/308* (2006.01)

(52) U.S. Cl.
CPC .............. *H01L 21/76229* (2013.01); *H01L 21/3083* (2013.01)
USPC ................... 438/702; 257/E21.215

(58) Field of Classification Search
CPC ............ H01L 21/76229; H01L 21/3081; H01L 21/0274; H01L 21/76232; H01L 2224/45144; H01L 21/0334; H01L 21/0335; H01L 21/30608; H01L 21/3083; H01L 21/3085; H01L 21/3088; H01L 21/823481
USPC ............... 438/689, 702; 257/E21.306
See application file for complete search history.

(56) References Cited

U.S. PATENT DOCUMENTS

| 5,705,321 | A | * | 1/1998 | Brueck et al. | 430/316 |
| 6,277,752 | B1 | | 8/2001 | Chen | 438/692 |
| 6,458,494 | B2 | * | 10/2002 | Song et al. | 430/5 |
| 6,864,152 | B1 | | 3/2005 | Mirbedini et al. | 438/427 |
| 2002/0022327 | A1 | | 2/2002 | Park | 436/300 |
| 2004/0029385 | A1 | * | 2/2004 | Manger et al. | 438/689 |
| 2004/0092115 | A1 | * | 5/2004 | Hsieh et al. | 438/694 |
| 2007/0066030 | A1 | * | 3/2007 | Kim | 438/427 |
| 2008/0283962 | A1 | | 11/2008 | Dyer et al. | 257/513 |

OTHER PUBLICATIONS

European First Office Action, European Patent Application No. 10 702 178.4-1235; 5 pages, Jun. 13, 2012.
Chinese Office Action, Application No. 201080004639.7, 21 pages, Apr. 28, 2013.

(Continued)

*Primary Examiner* — Duy T Nguyen
(74) *Attorney, Agent, or Firm* — King & Spalding L.L.P.

(57) ABSTRACT

A method for manufacturing a semiconductor die may have the steps of:—Providing a semiconductor substrate;—Processing the substrate to a point where shallow trench isolation (STI) can be formed;—Depositing at least one underlayer having a predefined thickness on the wafer;—Depositing a masking layer on top of the underlayer;—Shaping the masking layer to have areas of predefined depths;—Applying a photolithograthy process to expose all the areas where the trenches are to be formed; and—Etching the wafer to form silicon trenches wherein the depth of a trench depends on the location with respect to the masking layer area.

18 Claims, 5 Drawing Sheets

(56) References Cited

OTHER PUBLICATIONS

Chinese Office Action, Application No. 201080004639.7, 6 pages, Apr. 3, 2014.

Chinese Office Action, Application No. 201080004639.7, 22 pages, Nov. 20, 2013.

International PCT Search Report and Written Opinion, PCT/US2010/020845, 13 pages, Mailed Jun. 23, 2010.

* cited by examiner

METHOD FOR MANUFACTURING A SEMICONDUCTOR DIE WITH MULTIPLE DEPTH SHALLOW TRENCH ISOLATION

CROSS-REFERENCE TO RELATED APPLICATIONS

This application claims the benefit of U.S. Provisional Application No. 61/145,354 filed on Jan. 16, 2009, entitled "MULTIPLE DEPTH SHALLOW TRENCH ISOLATION WITH A SINGLE CRITICAL MASK AND ETCH STEP", which is incorporated herein in its entirety.

TECHNICAL FIELD

The present disclosure relates to a unique process that creates multi-depth shallow trenches within a die for device isolation.

BACKGROUND

Different sections on a semiconductor chip comprise electronic circuits with a plurality of structures that need to be electrically insulated from other parts of the semiconductor die. To this end, trenches are created around the respective structure. However, some structures require trenches that reach deeper into the substrate to fully provide insulation according to the respective specification. A variety of methods exists to create such isolation trenches within a semiconductor device. However, these conventional methods require further elaborate development if trenches with different depths on the same die are necessary.

Hence, there exists a need for an improved method providing formation of multiple depth shallow isolation trenches across a semiconductor die.

SUMMARY

According to an embodiment, a method for manufacturing a semiconductor die may comprise the steps of:—Providing a semiconductor substrate;—Processing the substrate to a point where shallow trench isolation (STI) can be formed;—Depositing at least one underlayer having a predefined thickness on the wafer;—Depositing a masking layer on top of the underlayer;—Shaping the masking layer to have areas of predefined depths;—Applying a photolithograthy process to expose all the areas where the trenches are to be formed; and—Etching the wafer to form silicon trenches wherein the depth of a trench depends on the location with respect to the masking layer area.

According to a further embodiment, the step of shaping the masking layer may comprise the steps of:—Applying a first lithography process to define areas where the deepest trenches are to be formed;—Performing an etch to remove the masking layer to a predefined thickness. According to a further embodiment, the method may further comprise the steps of repeating the lithography and etch processes for shaping the masking layer for at least another area for trenches having a different trench depth required by the product, with the area for shallowest trenches being the last one to be defined. According to a further embodiment, the masking layer can be completely removed in the area where the deepest trenches are to be formed. According to a further embodiment, the step of etching the wafer to form silicon trenches can be a dry etch process consists of multiple steps with each etch step having its own etch characteristics. According to a further embodiment, a first etch step may etch all films deposited on the wafer and the substrate none selectively. According to a further embodiment, different amounts of remaining masking layer in the open areas may result in different start times for silicon trench etches. According to a further embodiment, upon complete removal of the at least one underlayer over the shallowest trench areas, a second step can be used to etch all trenches to their final depths. According to a further embodiment, a masking film may have a different composition from an underlying nitride layer. According to a further embodiment, thickness and properties of a masking film can be selected to provide control of creating isolation trenches with different depths. According to a further embodiment, the etching can be stopped anywhere from within the masking layer to within the nitride layer depending on the trench depth relative to the other trench depths to be used in the same die.

According to another embodiment, a method for manufacturing a semiconductor die may comprise the steps of:—Providing a semiconductor substrate;—Processing the substrate to a point where shallow trench isolation (STI) can be formed;—Depositing underlayers having a predefined thickness on the wafer;—Depositing a masking layer on top of the underlayers;—Shaping the masking layer to have areas of predefined depths by:—Applying a first lithography process to define areas where the deepest trenches are to be formed;—Performing an etch to remove the masking layer to a predefined thickness; and—Repeating the lithography and etch processes for shaping the masking layer for at least another area for trenches having a different trench depth required by the product, with the area for shallowest trenches being the last one to be defined;—Applying a further photolithograthy process to expose all the areas where the trenches are to be formed; and—Etching the wafer to form silicon trenches wherein the depth of a trench depends on the location with respect to the masking layer area.

According to a further embodiment, the masking layer can be completely removed in the area where the deepest trenches are to be formed. According to a further embodiment, the step of etching the wafer to form silicon trenches can be a dry etch process consists of multiple steps with each etch step having its own etch characteristics. According to a further embodiment, a first etch step may etch all films deposited on the wafer and the substrate none selectively. According to a further embodiment, different amounts of remaining masking layer in the open areas may result in different start times for silicon trench etches. According to a further embodiment, upon complete removal of the underlayers over the shallowest trench areas, a second step can be used to etch all trenches to their final depths. According to a further embodiment, a masking film may have a different composition from an underlying nitride layer. According to a further embodiment, thickness and properties of a masking film can be selected to provide control of creating isolation trenches with different depths. According to a further embodiment, the etching can be stopped anywhere from within the masking layer to within the nitride layer depending on the trench depth relative to the other trench depths to be used in the same die.

The foregoing and other objects, features, and advantages of the invention will be apparent from the following, more particular, description of the preferred embodiments of the invention, as illustrated in the accompanying drawings.

DETAILED DESCRIPTION

As stated above, Shallow Trench Isolation (STI) provides optimum isolation at different trench depth for different devices. A "one-size-fit-all" approach would compromise isolation performance. For example, by utilizing a different depth trench isolation in the memory array versus the rest of the devices on a die, the memory cell endurance can be improved while total current leakage can be kept low. Multiple-depth isolation can also be used in radiation-tolerant or radiation-hardened devices.

According to various embodiments, a semiconductor fabrication process with multiple-depth trench isolation is proposed with which each trench depth can be tailored for optimum electrical isolation of certain device(s). Each additional trench depth is accomplished by adding a photolithography and an etch step defining areas of masking oxide with different depths. These masking oxide areas then control the final depth of a trench in the respective masking oxide area:

Add 1 step: 2 depths
Add 2 steps: 3 depths
Add 3 steps: 4 depths
Etc.

According to various embodiments, isolation trenches with as many different depths as required can be formed with each additional depth requiring one photolithography step and one etch step. Furthermore, according to further aspects an adjustable trench profile can be created between different locations across the die. With the various embodiments, isolation trenches of various depths and profiles can be created thereby reducing leakage current and improving memory cell endurance in a semiconductor die. A proposed fabrication process according to various embodiments that creates shallow isolation trenches with multiple depths and sidewall profiles for isolation of devices within a die can improve the chip reliability with low current leakage and excellent memory cell endurance.

Figure 1:
FIGS. 1-9 show different steps in creating multiple depth shallow isolation trenches within a semiconductor die.
Figure 2:
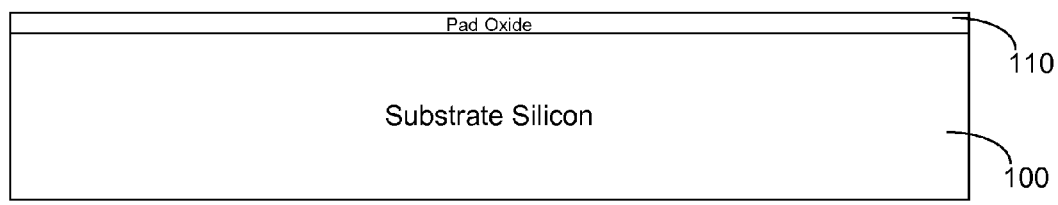
Figure 3:
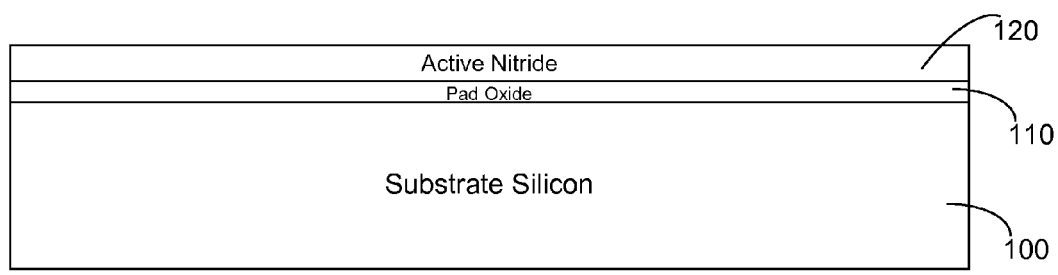

According to an embodiment, a semiconductor grade silicon wafer (substrate) is processed to the point where shallow trench isolation (STI) can be formed. FIGS. 1-4*a* show different steps of preparing a silicon wafer. FIG. 1 shows the substrate 100. An active layer is formed on this substrate 100. For example, a thin layer of as pad oxide 110, such as silica, can be deposited in a first step as shown in FIG. 2. A second layer of silicon nitride 120 with a different thickness can be deposited on top of the first layer 110 as shown in FIG. 3. A masking layer 130 is then deposited on top of the active stack 110, 120. The masking film 130 could be of a different composition from the underlying layers 110, 120.

Figure 4A:
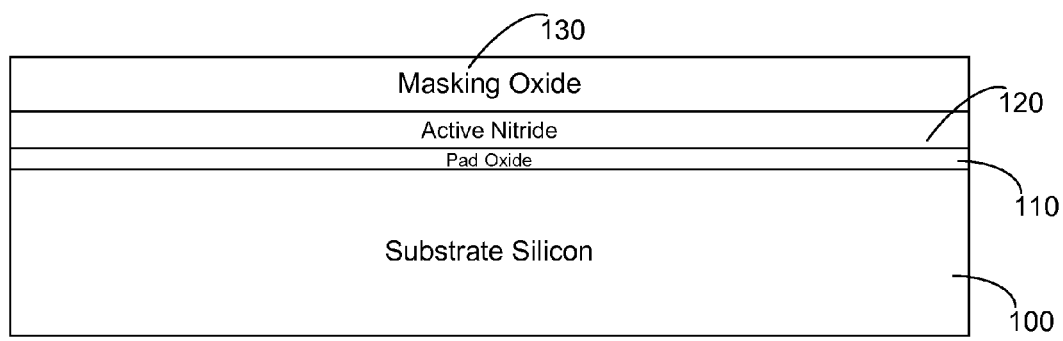
Figure 4B:
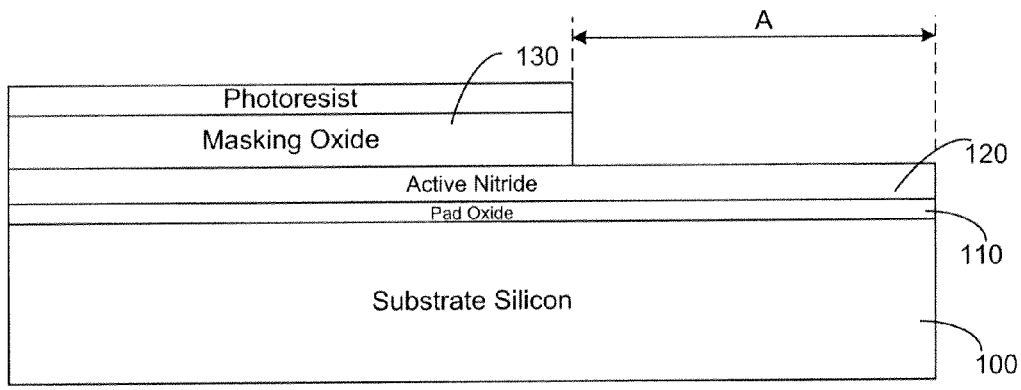
Figure 4C:
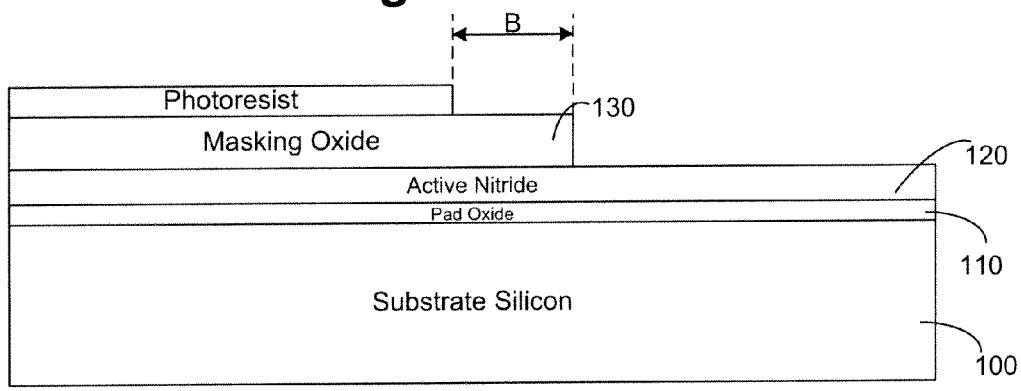
Figure 4D:
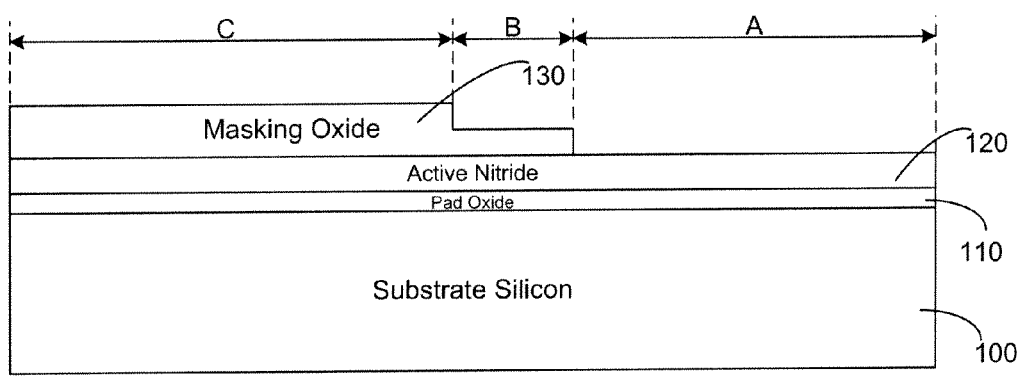

The masking layer plays a critical role in the formation of multi-depth shallow silicon trenches. Thickness and properties of the masking layer film are carefully selected to provide optimum control of creating isolation trenches with different depths as shown in FIGS. 4*b*-4*d*. For example, if trenches with three different depths are required, then the masking oxide 130 is patterned as shown in FIG. 4*b* in a first lithography/etching step to define an area A which will later comprise the deepest trenches. Then in an additional lithography step another area B is defined which will comprise "medium deep" trenches as shown in FIG. 4B. After etching, three areas with masking oxide of different depth A, B, C are defined as shown in FIG. 4*d*. The order of etching can be different. For example, area A and B could be etched first to the final level of area B and then area B and C could be masked and area A could be etched to remove the masking oxide which would result in the same structure as shown in FIG. 4*c*.

The areas may have any form depending on the location on the die. They do not have to be continuous as shown in the example. Also, the number of areas is not limited and depends on the number of trenches with different depths. Area A shows no masking oxide. However, in other embodiments, this area which will later contain the deepest trenches may have also a thin masking oxide layer.

Figure 5:
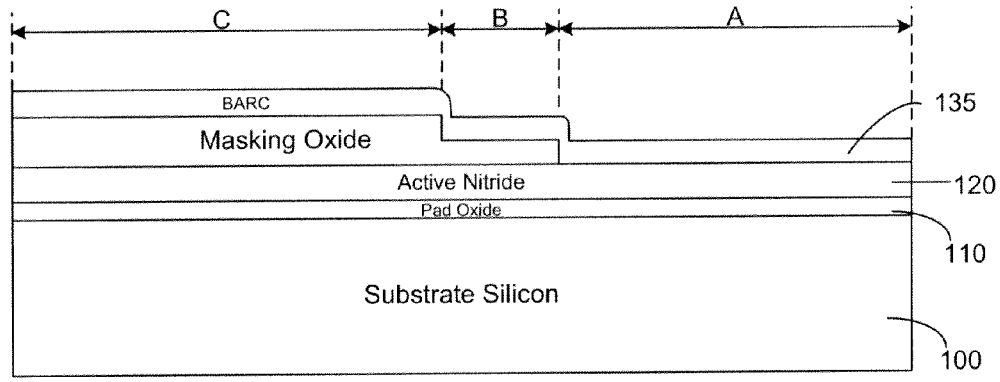

The etching of the masking oxide is performed by a non-critical lithography process to cover the areas where the shallower trenches are to be formed as shown in FIG. 4*d*. Next a bottom anti-reflecting coating (BARC) layer 135 is deposited on top of the masking layer 130 as shown in FIG. 5. Then the actual formation of the differently sized trenches follows.

Figure 6:
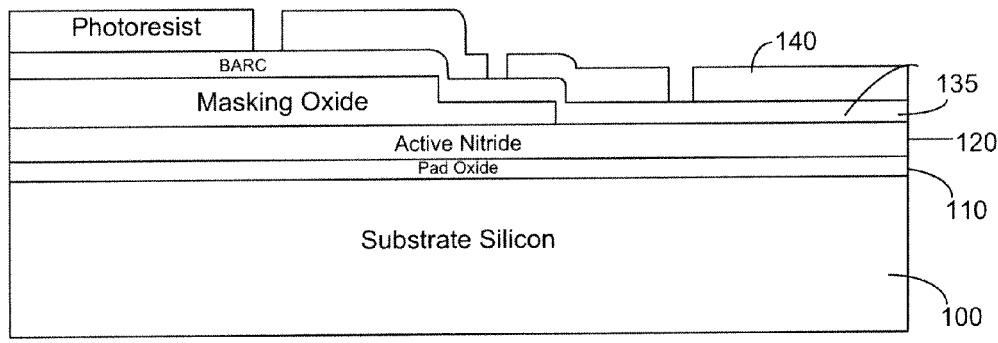
Figure 7A:
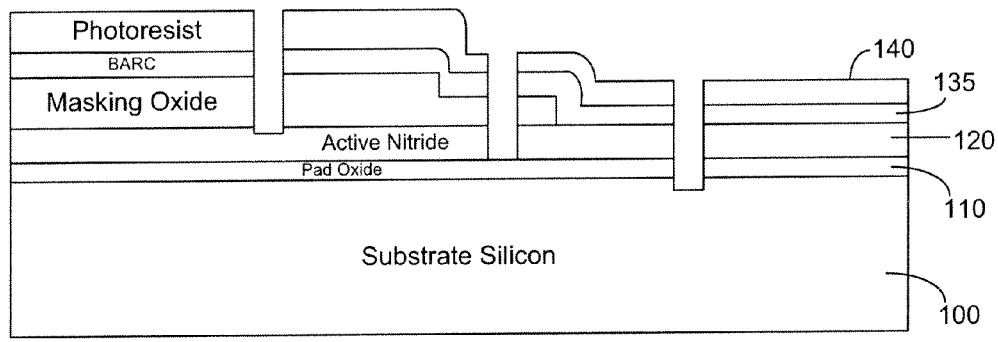
Figure 7B:
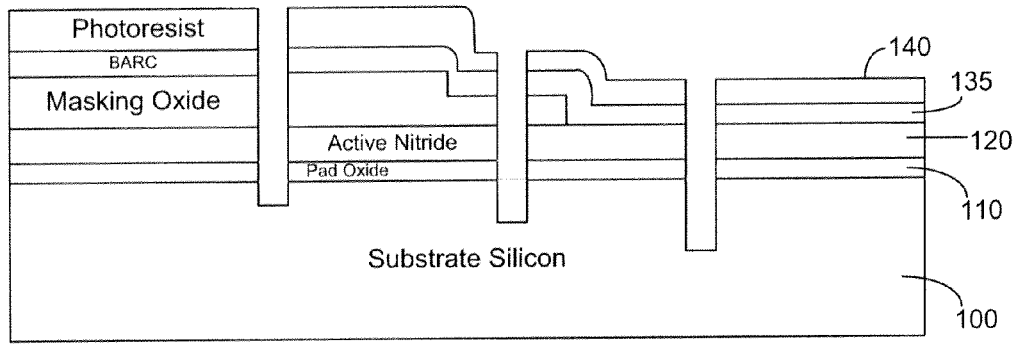

First, a photoresist layer 140 is deposited and patterned as shown in FIG. 6. An etch is then performed to remove part of the exposed stacking materials as shown in FIGS. 7*a* and *b*. FIG. 7*a* shows the etching progress. The etch can be stopped anywhere from within the masking layer to within the nitride layer depending on the trench depth relative to the other trench depths to be formed in the same die as shown in FIG. 7*b*. During the final (critical) step of the process, the trenches would finish with three different depths. The non-critical etching of the masking oxide can, however, be repeated over and over again if multiple depths are required.

Figure 8:
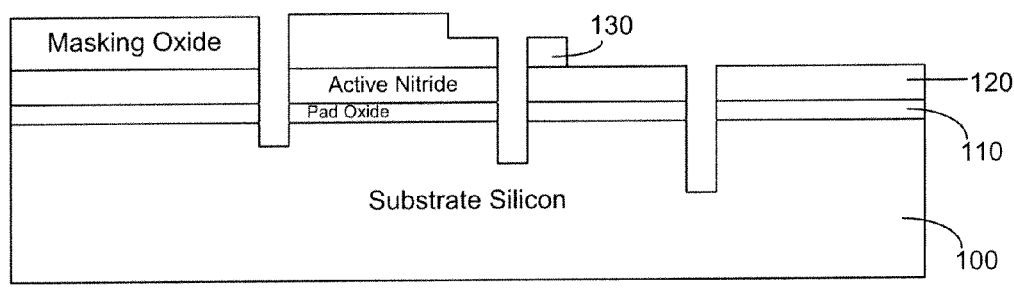
Figure 9A:
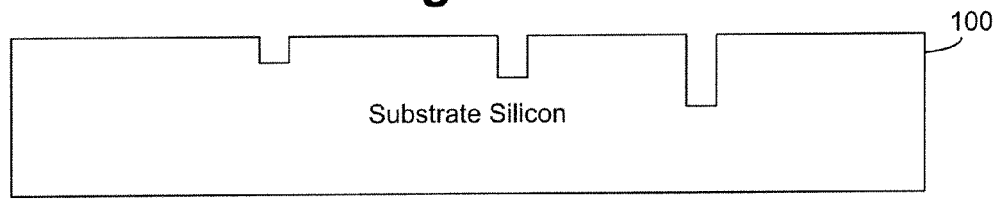

Thus, after the masking oxide has been partially or fully removed in all the areas where the trenches are to be formed by the aforementioned steps, the critical photolithograthy process as shown in FIGS. 7*a* and *b* is used to expose all the areas where the trenches are to be formed. Thus, the critical photolithography steps has controlled critical dimensions, in other words, they reach predefined depths within a certain range, whereas the initial lithography steps do not need to do this and thus do not have exactly controlled dimensions. The critical etching steps can be dry etching to form silicon trenches with different depths and sidewall profiles as shown in FIGS. 7*a* and *b*. The dry etch process may consists of multiple steps with each etch step having its own etch characteristics. The first etch step etches all films deposited on the wafer (Bottom Anti-Reflecting Coating (BARC), masking layer, silicon nitride, silica) and the substrate none selectively. Different amounts of remaining stacking materials in the open areas result in different start times for silicon trench etches as shown in FIGS. 7*a* and *b*. Upon complete removal of stacking materials over the shallowest trench areas, a second step can be used to etch all trenches to their final depths as shown in FIG. 7*b*. Removing of the photo resist and BARC layer is shown in FIG. 8. The theoretical result after removal of the remaining layers is shown in FIG. 9*a*.

Figure 9B:
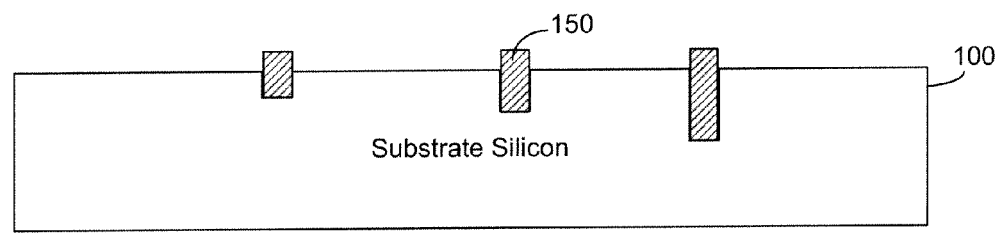

As common in the art, the trenches will however be filled with an insulating material and the wafer will be polished at chemical-mechanical polishing (CMP). Thus, the insulating material would be deposited after the step shown in FIG. 8. The wafer is then processed through CMP which removes all the bulk oxide 130 and stops at the nitride layer 120. The structure is then removed leaving a structure with insulating material 150 that resembles FIG. 9*b*.

Figure 10:
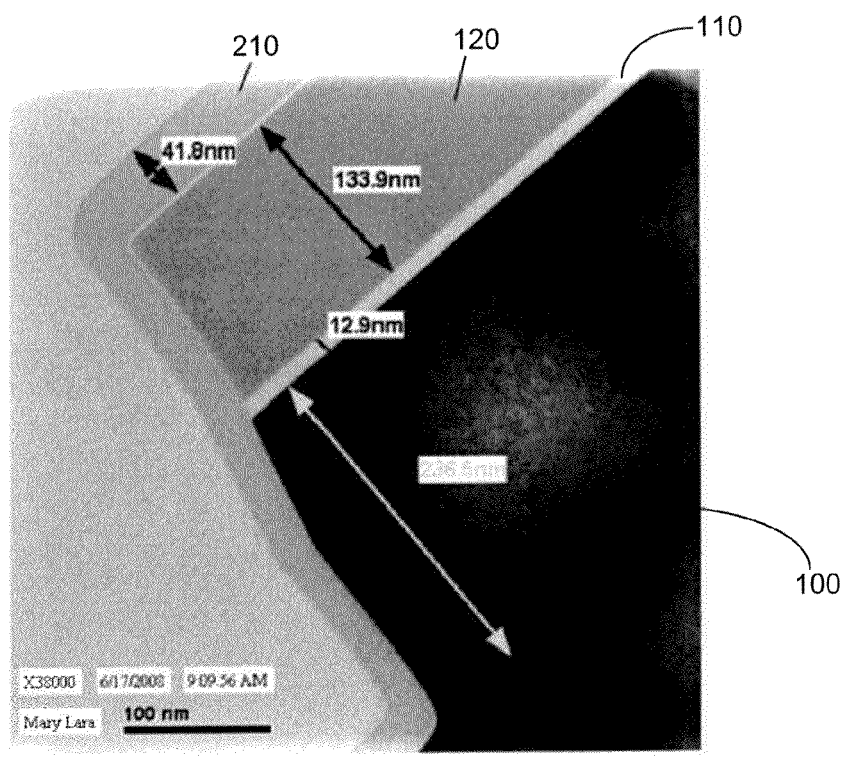
FIGS. 10 and 11 show transmission electron microscope (TEM) cross-sectional images of a wafer processed according to an embodiment.
Figure 11:
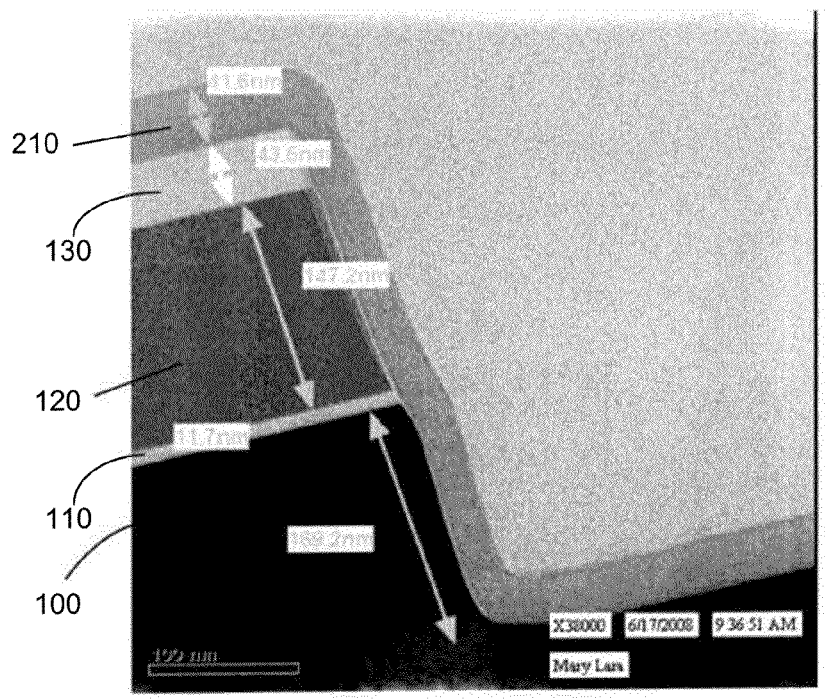

FIGS. 10 and 11 show transmission electron microscope (TEM) cross-sectional 100 images of a wafer processed according to the embodiment.

In summary, according to various embodiments, a method for fabricating a semiconductor die may comprise the following steps:

Providing a semiconductor substrate;

Processing the substrate to a point where shallow trench isolation (STI) can be formed;

Depositing at least one underlayer with typical thicknesses on the wafer;

Depositing a masking layer on top of the underlayers;

Applying a non-critical lithography process on the masking layer for defining the areas of differently sized trenches which are to be formed;

Performing an etch of the masking layer to form the different areas;

Optionally, repeating the lithography and etch processes for additional trenches with shallower depths required by the product, with the shallowest trenches being the last one to be defined.

After the underlayer(s) have been partially and/or fully removed in all the areas where the trenches are to be formed, applying a critical photolithograthy process to expose all the areas where the trenches are to be formed; and Dry etching the wafer to form silicon trenches with different depths and sidewall profiles.

The invention, therefore, is well adapted to carry out the objects and attain the ends and advantages mentioned, as well as others inherent therein. While the invention has been depicted, described, and is defined by reference to particular preferred embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A method for manufacturing a semiconductor die comprising the steps of:
    providing a semiconductor substrate;
    processing the substrate to a point where shallow trench isolations (STI) can be formed;
    depositing underlayers having a predefined thickness on the substrate;
    depositing a single masking layer having a first thickness on top of the underlayers, wherein the single masking layer is different composition from an underlying nitride layer;
    etching the single masking layer to have at least one area having a second thickness which is greater than zero and smaller than said first thickness;
    applying a photolithograthy process to create openings in a top photoresist layer where the shallow trench isolations are to be formed, wherein at least one opening is within an area having the first thickness and at least a second opening is within the at least one area having the second thickness; and
    etching the substrate to form silicon trenches wherein the depth of a silicon trench depends on the thickness of the single masking layer at the location of the respective opening.

2. The method according to claim 1, wherein the step of etching the single masking layer comprises the steps of:
    applying a first lithography process to define areas within the single masking layer where the deepest trenches are to be formed and;
    performing an etch to reduce the thickness of the single masking layer to the second thickness.

3. The method according to claim 2, comprising repeating the first lithography and etch processes for etching the single masking layer for at least another area for trenches having a different trench depth required by the product, with the area for shallowest trenches being the last one to be defined.

4. The method according to claim 3, wherein the single masking layer is completely removed in the area where the deepest trenches are to be formed.

5. The method according to claim 1, wherein the step of etching the substrate to form silicon trenches is a dry etch process consists of multiple steps with each etch step having its own etch characteristics.

6. The method according to claim 5, wherein a first etch step etches all films deposited on the substrate none selectively.

7. The method according to claim 6, wherein upon complete removal of the underlayers over the shallowest trench areas, a second step is used to etch all trenches to their final depths.

8. The method according to claim 1, wherein different amounts of remaining masking layer in the open areas result in different start times for silicon trench etches.

9. The method according to claim 1, wherein thickness and properties of the single masking layer are selected to provide control of creating isolation trenches with different depths.

10. The method according to claim 1, wherein the etching can be stopped anywhere from within the single masking layer to within the underlayers depending on the trench depth relative to the other trench depths to be used in the same die.

11. A method for manufacturing a semiconductor die comprising the steps of:
    providing a semiconductor substrate;
    processing the substrate to a point where shallow trench isolations (STI) can be formed;
    depositing underlayers having a predefined thickness on the substrate;
    depositing a single masking layer having a first thickness on top of the underlayers, wherein the single masking layer has different composition from an underlying nitride layer;
    shaping the single masking layer to have at least one area having a second thickness which is greater than zero and smaller than said first thickness by:
        applying a first lithography process to define areas within the single masking layer where the deepest trenches are to be formed;
        performing an etch to reduce the thickness of the single masking layer to the second thickness; and
        repeating the first lithography and etch processes for shaping the single masking layer for at least another area for trenches having a different trench depth required by the product, with the area for shallowest trenches being the last one to be defined;
    applying a further photolithograthy process to create openings in a top photoresist layer where the shallow trench isolations are to be formed, wherein at least one opening is within an area having the first thickness and at least a second opening is within the at least one area having a second thickness; and
    etching the substrate to form silicon trenches wherein the depth of a trench depends on the thickness of the single masking layer at the location of the respective opening.

12. The method according to claim 11, wherein the single masking layer is completely removed in the area where the deepest trenches are to be formed.

13. The method according to claim 11, wherein the step of etching the substrate to form silicon trenches is a dry etch process consists of multiple steps with each etch step having its own etch characteristics.

14. The method according to claim 13, wherein a first etch step etches all films deposited on the substrate none selectively.

15. The method according to claim 14, wherein upon complete removal of the underlayers over the shallowest trench areas, a second step is used to etch all trenches to their final depths.

16. The method according to claim 11, wherein different amounts of remaining masking layer in the open areas result in different start times for silicon trench etches.

17. The method according to claim 11, wherein thickness and properties of the single masking layer are selected to provide control of creating isolation trenches with different depths.

18. The method according to claim 11, wherein the etching can be stopped anywhere from within the single masking layer to within the underlayers depending on the trench depth relative to the other trench depths to be used in the same die.

* * * * *